(12) United States Patent
Kuo

(10) Patent No.: US 7,661,462 B2
(45) Date of Patent: Feb. 16, 2010

(54) HEAT DISSIPATION ASSEMBLY

(75) Inventor: Szu-Wei Kuo, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 12 days.

(21) Appl. No.: 11/862,202

(22) Filed: Sep. 27, 2007

(65) Prior Publication Data

US 2008/0170365 A1   Jul. 17, 2008

(30) Foreign Application Priority Data

Jan. 11, 2007   (CN)   ........................ 2007 1 0200040

(51) Int. Cl.
*F28F 7/00*   (2006.01)
*H05K 7/20*   (2006.01)

(52) U.S. Cl. ..................... 165/80.3; 165/121

(58) Field of Classification Search ................ 165/80.3, 165/104.33, 185, 104.34, 121, 67, 76, 79; 361/695, 697, 709
See application file for complete search history.

(56) References Cited

U.S. PATENT DOCUMENTS

| | | | |
|---|---|---|---|
| 5,526,875 A | 6/1996 | Lin | |
| 5,835,347 A | 11/1998 | Chu | |
| 6,419,007 B1 | 7/2002 | Ogawara et al. | |
| 6,520,250 B2 * | 2/2003 | Lee et al. | 165/121 |
| 6,600,650 B1 * | 7/2003 | Lee | 361/697 |
| 6,667,884 B1 * | 12/2003 | Lee et al. | 361/697 |
| 7,044,204 B2 * | 5/2006 | Chen et al. | 165/122 |
| 7,131,485 B2 * | 11/2006 | Yu et al. | 165/80.3 |
| 7,289,322 B2 * | 10/2007 | Chen et al. | 361/695 |
| 2002/0075649 A1 * | 6/2002 | Chou | 361/697 |
| 2002/0167798 A1 * | 11/2002 | Jui-Yuan | 361/697 |
| 2007/0119567 A1 * | 5/2007 | Yeh et al. | 165/80.3 |

FOREIGN PATENT DOCUMENTS

CN   2181025 Y   10/1994

* cited by examiner

*Primary Examiner*—Tho V Duong
(74) *Attorney, Agent, or Firm*—Frank R. Niranjan

(57) ABSTRACT

A heat dissipation assembly includes a heat sink and a fan. The heat sink device has a base and a plurality of fins formed on the base, the fins are parallel with each other, one or more of the fins cooperatively form at least two concave engagement parts. The fan has at least two elastic arms extending from middle positions of two opposite sides of the fan, an engagement hook is formed at an end of the at least two arms. The at least two engagement hooks are engagable with the at least two engagement parts, for fastening the fan on the heat sink device.

3 Claims, 6 Drawing Sheets

HEAT DISSIPATION ASSEMBLY

BACKGROUND

1. Field of the Invention

The present invention relates to a heat dissipation assembly. Particularly, the present invention relates to a heat dissipation assembly for dissipating heat generated by a chip.

2. Description of Related Art

Electronic devices use heat dissipation assemblies for dissipating heat generated by components therein, thus preventing the components from being overheated. Typically, a heat sink device is assembled on top of a heat-generating component, for absorbing heat of the component and radiating the heat to a much larger space, which benefits dissipation of the heat. Furthermore, a fan is fixed on the heat sink device; the fan assists for heat dissipation. The fan and the heat sink device respectively have holes formed on the sides, and screws extend through the holes to fix the fan on the heat sink device.

However, the holes weaken the heat sink devices, causing them to be easily distorted or even to break. Furthermore, it is a tedious task to manipulate screws during installation or removal of the fan. Consequently, a heat dissipation assembly, which is easy to install and uninstall, is needed in the industry.

SUMMARY

In one embodiment, a heat dissipation assembly includes a heat sink and a fan. The heat sink device has a base and a plurality of fins formed on the base, the fins are parallel with each other, one or more of the fins cooperatively form at least two concave engagement parts. The fan has at least two elastic arms extending from middle positions of two opposite sides of the fan, an engagement hook is formed at an end of the at least two arms. The at least two engagement hooks are engagable with the at least two engagement parts, for fastening the fan on the heat sink device.

Other advantages and novel features of the present heat dissipation assembly will become more apparent from the following detailed description of preferred embodiments when taken in conjunction with the accompanying drawings, in which:

DETAILED DESCRIPTION

Figure 1:
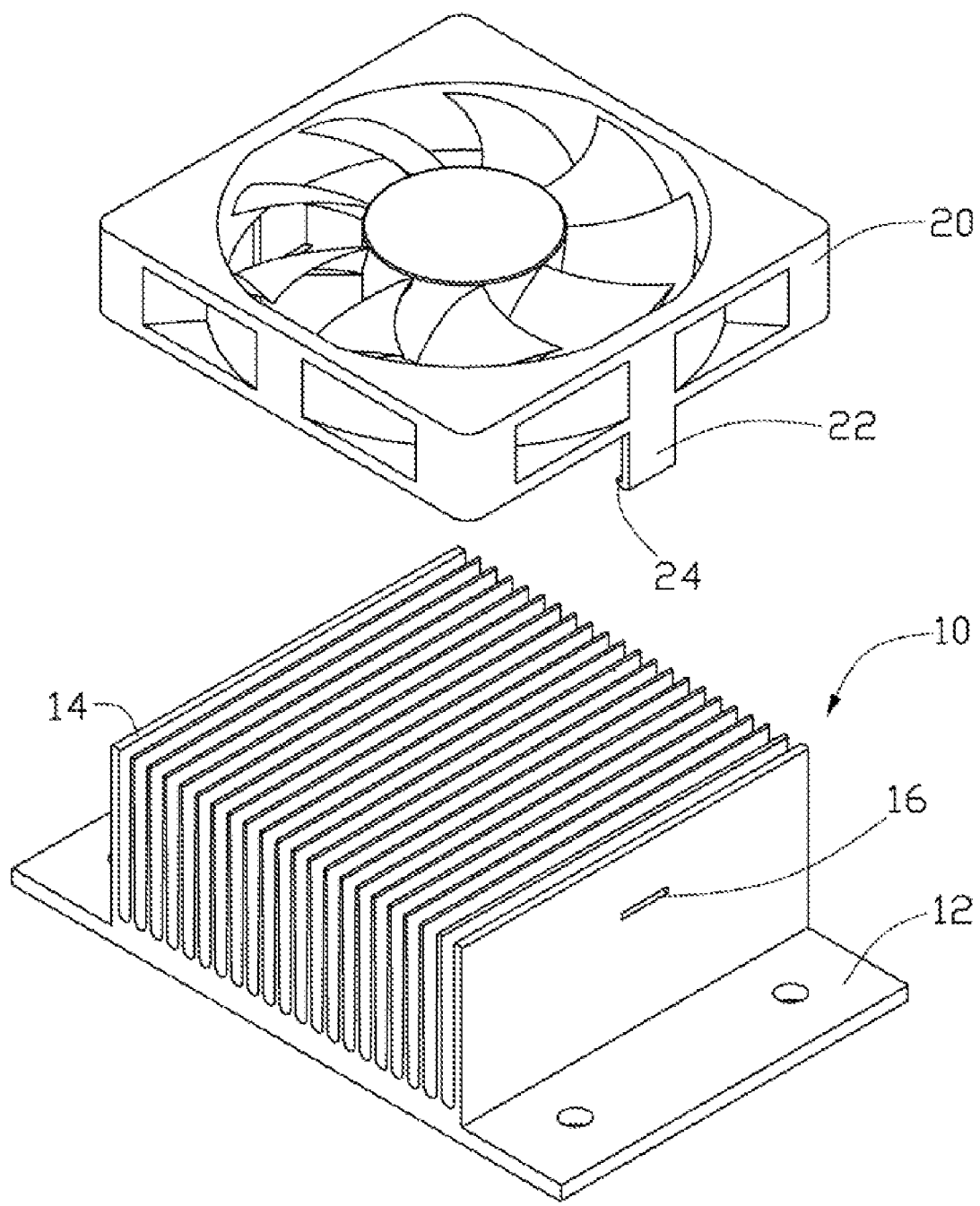
FIG. 1 is an exploded view of a heat dissipation assembly in accordance with a first embodiment.

Referring to FIG. 1, a heat dissipation assembly in accordance with an exemplary embodiment includes a heat sink device 10 and a fan 20.

The heat sink device 10 includes a base 12 and a plurality of parallel fins 14 extending from the base 12. The fins 14 are generally rectangular. A hole 16 is defined in a middle portion of each of two outer fins 14. The portions bounding the holes 16 respectively form engagement parts. The holes 16 are generally quadrate slots parallel to the base 12, and extend along longitudinal directions of the fins 14.

The fan 20 is generally rectangular, which includes a pair of elastic arms 22 extending from opposite sides thereof, corresponding to the holes 16 of the fins 14. At an end of each arm 22, a hook 24 is formed. The hooks 24 extend from the arms 22 toward each other.

Figure 2:
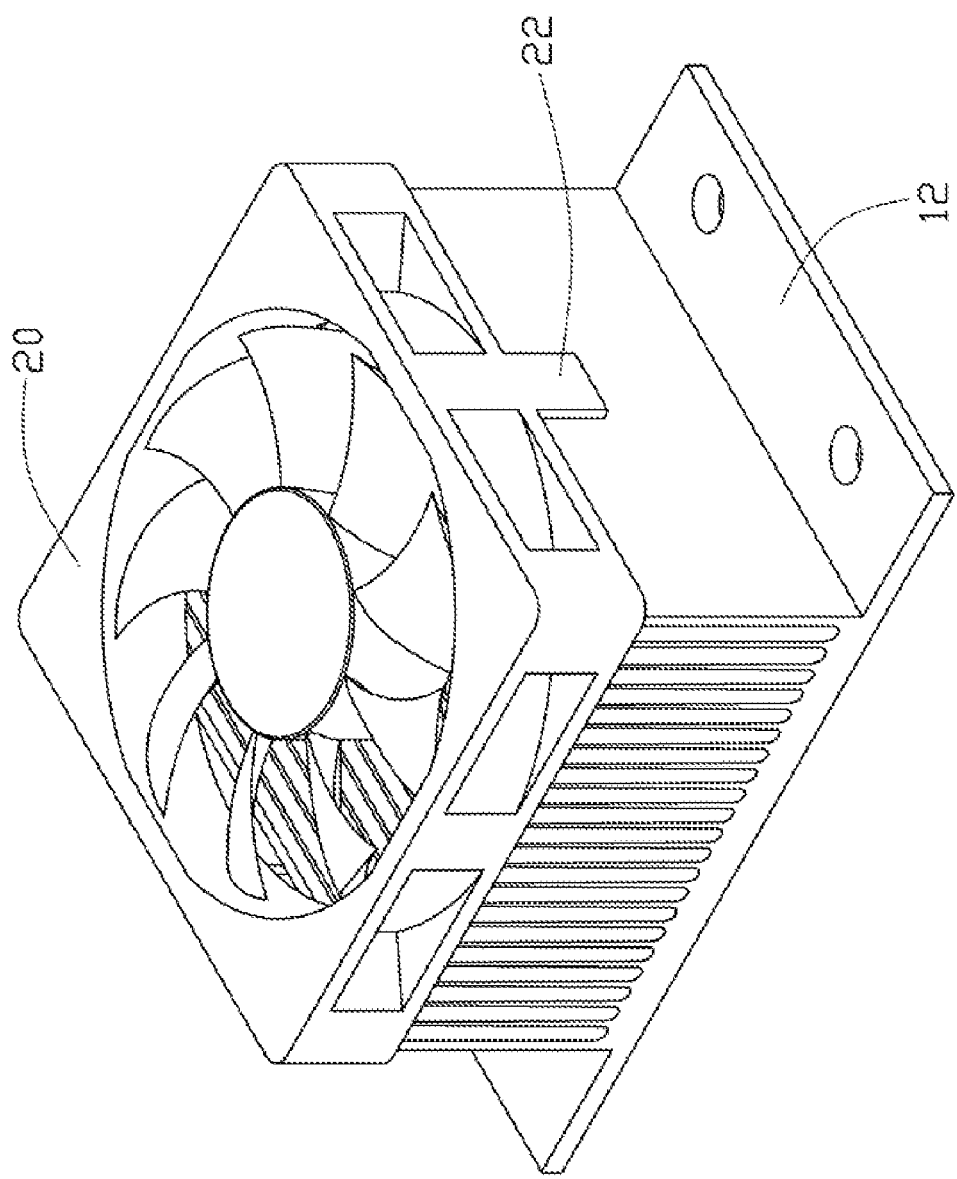
FIG. 2 is an assembled view of the heat dissipation assembly of FIG. 1.

Referring to FIG. 2, in assembly, the arms 22 of the fan 20 are deformed outwardly with the hooks 24 tightly engaging with the two outer fins 14 respectively, the fan 20 is moved toward the top of the fins 14, the hooks 24 slide along the outer fins 14 respectively, until the hooks 24 align with the holes 16 of the outer fins 14, respectively. Thus the hooks 24 are pushed to engage in the holes 16 due to the restoring elastic force of the arms 22, and the fan 20 is fixed on the heat sink device 10 accordingly.

In disassembly, the hooks 24 are disengaged from the holes 16, and the fan 20 can be taken away from the heat sink device 10.

Figure 3:
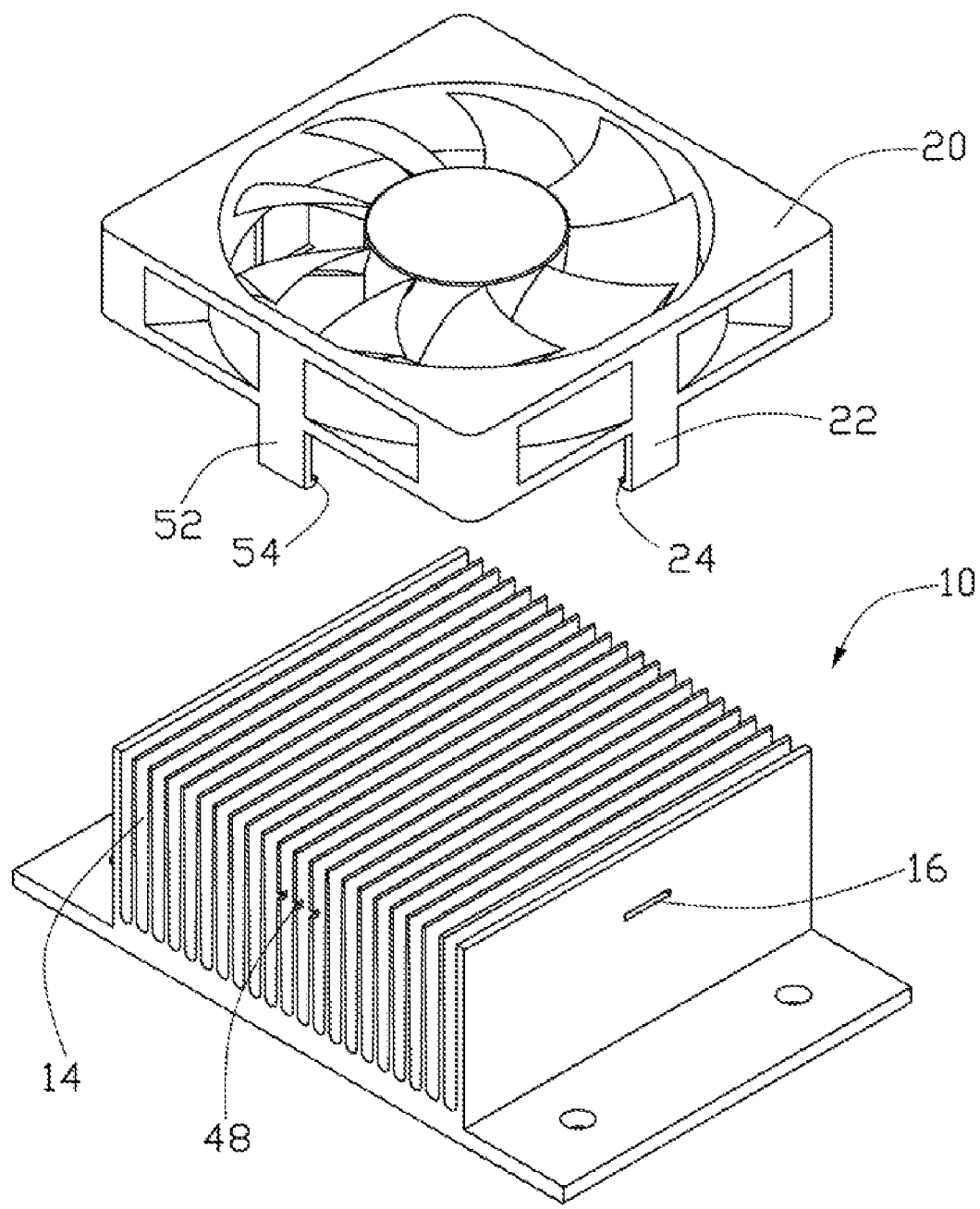
FIG. 3 is an exploded view of the a dissipation assembly in accordance with a second embodiment.

Referring to FIG. 3, a heat dissipation assembly in accordance with a second exemplary embodiment is shown. The heat sink device 10 of this embodiment also includes at least an engagement part 48, which is formed in a middle position of the heat sink device 10, by portions on ends of a plurality of selected fins 14 defining a plurality of aligned notches respectively. The engagement part 48 is generally quadrate, and perpendicular to the fins 14. The fan 20 of this embodiment further includes at least one elastic arm 52. At an end of the at least one arm 52, an engagement hook 54 is formed corresponding to the engagement part 48.

Figure 4:
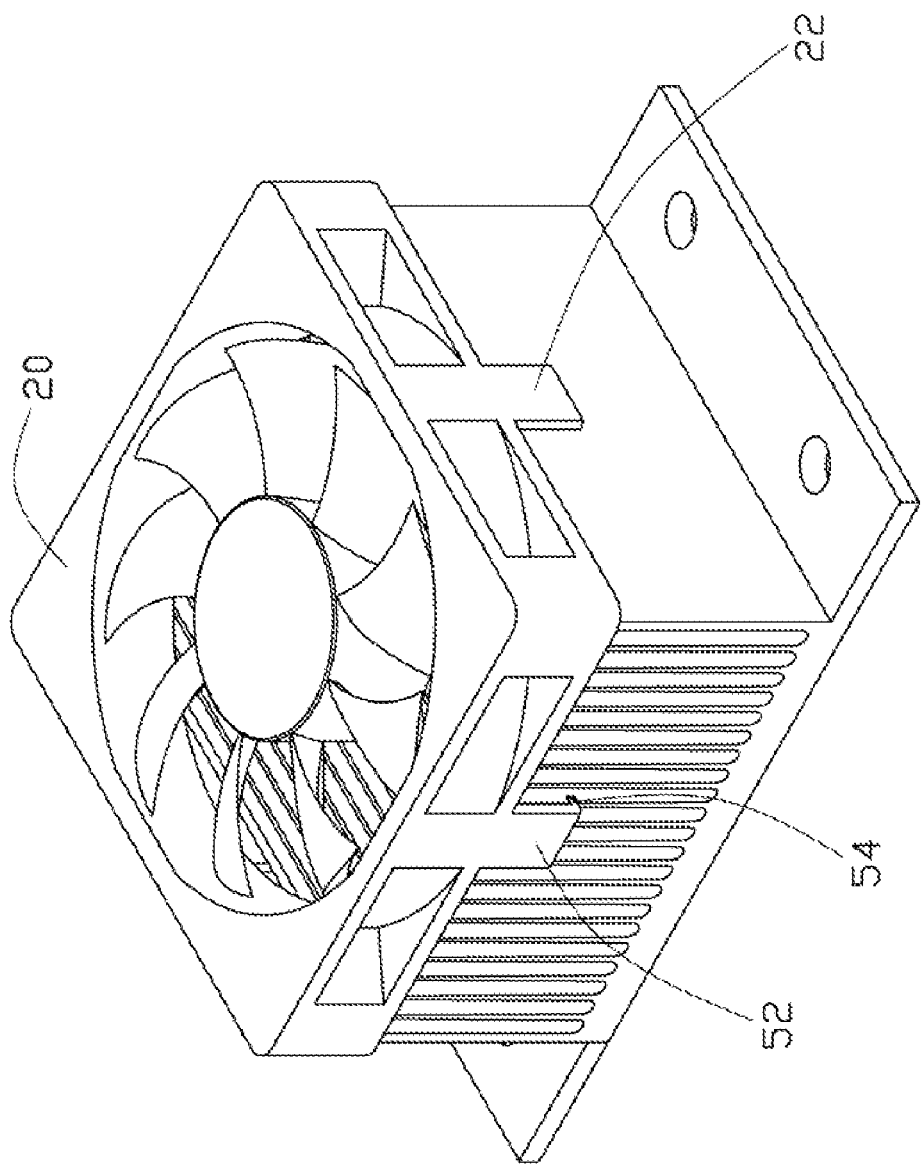
FIG. 4 is an assembled view of the heat dissipation assembly of FIG. 3.

Referring to FIG. 4, when assembled, the arms 22, 52 of the fan 20 are respectively located in a position corresponding to the holes 16 and the engagement part 48 of the heat sink device 10. The hooks 24 and the engagement hook 54 are respectively engaged in the hole 16 and the engagement part 48. Thus the fan 20 is fixed on the heat sink device 10 due to the elastic force of the arms 22 and the elastic arm 52. When disassembled, the hooks 24 and the engagement hook 54 are respectively disengaged from the holes 16 and the engagement part 48 by deforming the corresponding arms 22, 52 outward, and the fan 20 is removed from the heat sink device 10 accordingly.

Figure 5:
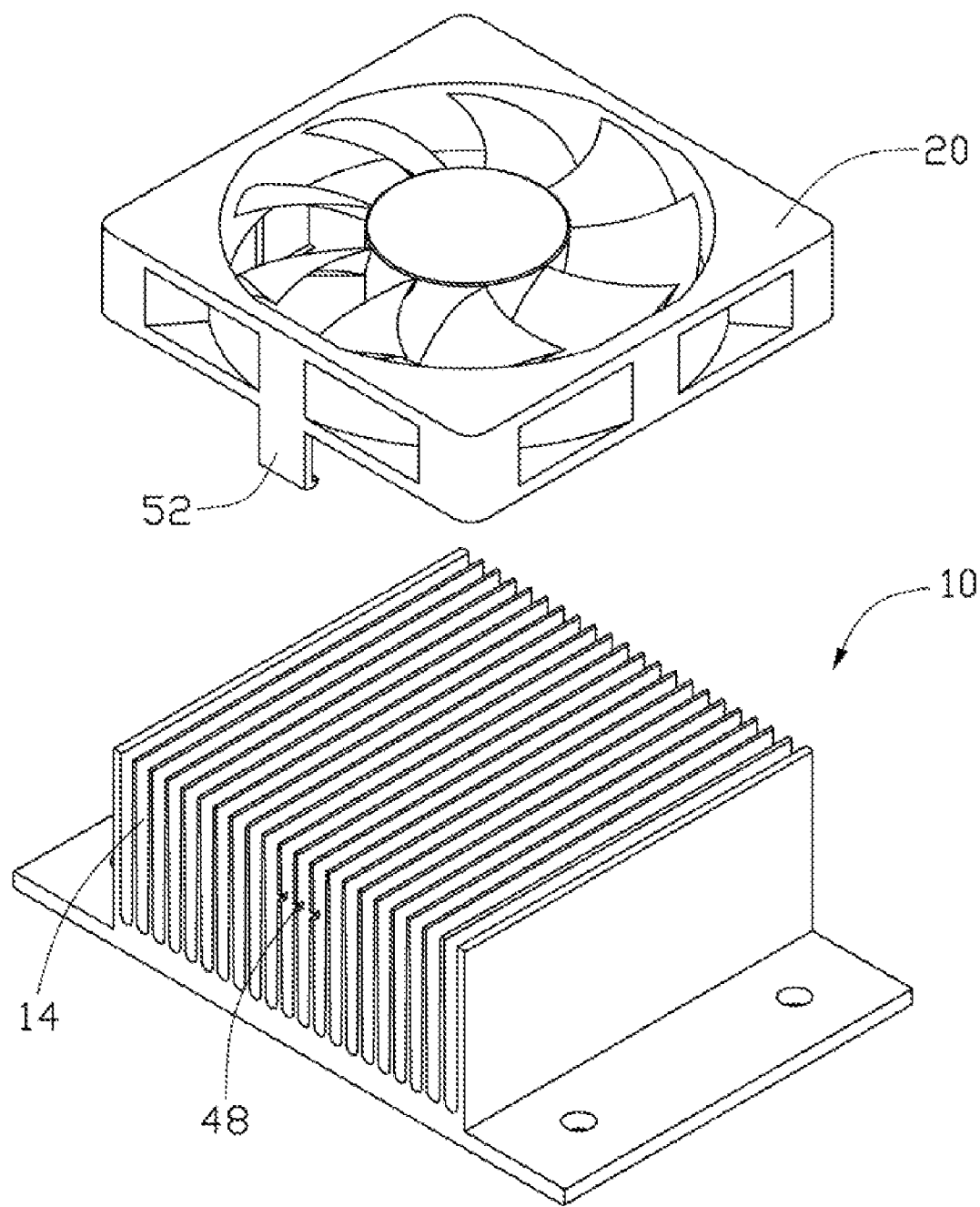
FIG. 5 is an exploded view of a heat dissipation assembly in accordance with a third embodiment.
Figure 6:
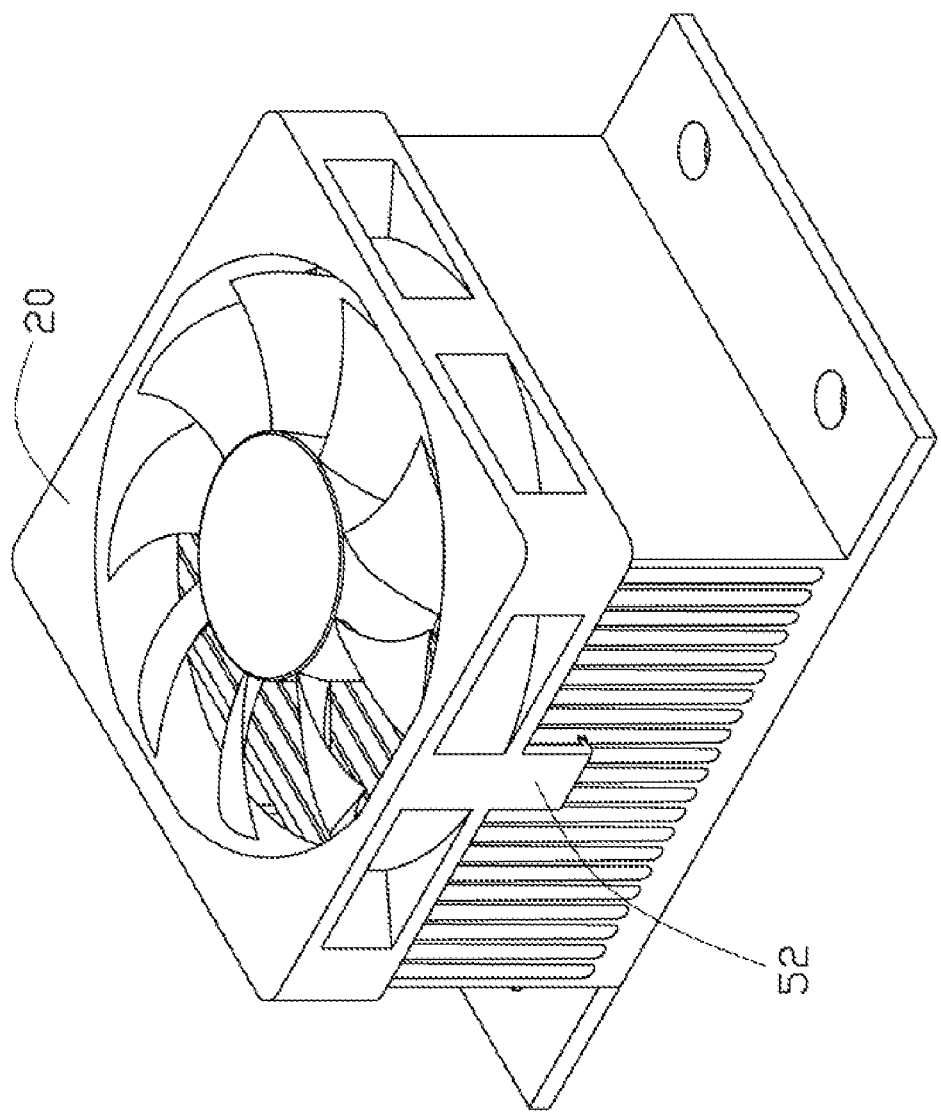
FIG. 6 is an assembled view of the heat dissipation assembly of FIG. 5.

Referring to FIG. 5, a heat dissipation assembly in accordance with a third embodiment is shown. The heat sink device 10 includes a pair of engagement parts 48 formed by a plurality of notches formed on ends of selected fins 14, but does not include holes on the outer fins 14. Correspondingly, the fan 20 includes a pair of elastic arms 52 with engagement hooks 54 at the ends, but not the arms 22 with the hooks 24.

Assembly and disassembly of the fan 20 to the heat sink device 10 of this embodiment are similar to that of the FIGS. 3 and 4.

The heat dissipation assemblies avoid possible distortion of the heat sink devices, and make assembly and disassembly of the heat dissipation assemblies easy.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A heat dissipation assembly comprising:
   a heat sink having a base and a plurality of parallel fins extending upward from the base, one or more of the fins cooperatively forming two engaging slots at opposite sides of the fins, the engaging slots being parallel to the base; and
   a fan having two elastic arms extending from middle portions of opposite sides of the fan, an engagement hook being formed at an end of each of the arms; wherein the elastic arms are deformable to enlarge a space between the arms to allow top portions of the fins inserting into the space and reboundable to reduce the space to allow the engagement hooks interlocking with the fins at the slots, thereby fastening the fan on the heat sink; wherein the fins and the fan are rectangular, another two elastic arms respectively extend from middle portions of another opposite sides of the fan, and another two engaging slots are respectively defined at another opposite sides of the fins configured to engage with the another two elastic arms.

2. The heat dissipation assembly as described in claim 1, wherein a plurality of notches is defined at opposite ends of some middle of the fins, the notches cooperatively forming the engaging slots.

3. The heat dissipation assembly as described in claim 1, wherein the two engaging slots are respectively defined at two out fins.

* * * * *